(12) United States Patent
Yap

(10) Patent No.: US 6,364,331 B1
(45) Date of Patent: Apr. 2, 2002

(54) METHOD AND APPARATUS FOR TRANSFERRING WAFER CASSETTES IN MICROELECTRONIC MANUFACTURING ENVIRONMENT

(75) Inventor: Hoon-Yeng Yap, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/410,400

(22) Filed: Oct. 1, 1999

(51) Int. Cl.[7] .............................. B62B 3/04; B62B 3/10
(52) U.S. Cl. .............................. 280/47.371; 280/47.29; 280/651
(58) Field of Search .............................. 280/47.2, 47.22, 280/47.28, 47.29, 47.34, 47.35, 47.371, 79.11, 79.3, 400, 638, 639, 651, 655, 35

(56) References Cited

U.S. PATENT DOCUMENTS

| | | | | |
|---|---|---|---|---|
| 2,744,761 A | * | 5/1956 | Steele | 280/47.22 |
| 3,499,658 A | * | 3/1970 | Fernholz et al. | 280/47.2 |
| 3,540,753 A | * | 11/1970 | Hanson | 280/47.34 |
| 3,711,111 A | * | 1/1973 | Crawford | 280/47.22 |
| 3,966,221 A | * | 6/1976 | Beam et al. | 280/79.3 |
| 4,091,942 A | * | 5/1978 | Shelton | 280/47.2 |
| 4,266,765 A | * | 5/1981 | Sandoval et al. | 280/47.371 |
| 4,493,492 A | * | 1/1985 | Balabanova | 280/79.11 |
| 4,557,201 A | * | 12/1985 | Webb, Jr. | 280/79.11 |
| 4,655,466 A | * | 4/1987 | Hanakoa | 280/47.34 |
| 4,681,330 A | * | 7/1987 | Misawa | 280/47.2 |
| 4,863,179 A | * | 9/1989 | Isaacs | 280/79.11 |
| 5,842,708 A | * | 12/1998 | Miyaoka | 280/47.35 |
| 5,938,396 A | * | 8/1999 | Audet | 280/47.29 |

FOREIGN PATENT DOCUMENTS

| | | | | |
|---|---|---|---|---|
| GB | 933343 | * | 8/1963 | 280/47.29 |
| GB | 2248219 | * | 4/1992 | 280/47.29 |

* cited by examiner

Primary Examiner—Frank Vanaman
(74) Attorney, Agent, or Firm—Schwegman, Lundberg, Woessner & Kluth, P.A.

(57) ABSTRACT

A wafer transport cart comprises a wheeled support structure and an upright member which is pivotably coupled to the support structure. The upright member has a handle which is pivotably coupled to a wafer cassette support, which comprises a pair of fork-like arms. Wafer production personnel can maneuver the cart adjacent a wafer manufacturing load port, and unload a wafer cassette from the cart to the load port or vice versa, by employing movements of the upright member and the handle. Shock-absorbing dampers are provided for the upright member and the handle. An inter-cart coupling mechanism enables a plurality of carts to be joined together for tandem transport within the manufacturing facility. The arms mate with mating regions on the wafer cassette and on the load port. An alignment notch mates with an alignment pin on the load port. Also described are methods of using the wafer transport cart to load and unload a wafer cassette.

5 Claims, 5 Drawing Sheets

METHOD AND APPARATUS FOR TRANSFERRING WAFER CASSETTES IN MICROELECTRONIC MANUFACTURING ENVIRONMENT

TECHNICAL FIELD

The invention relates to the manufacture of microelectronic circuits and, in particular, to a method and apparatus for transferring wafer cassettes in a microelectronic manufacturing environment.

BACKGROUND OF THE INVENTION

In the field of microelectronic circuits, manufacturers are increasingly employing very large and heavy wafers, some of which are 300 millimeters in diameter, because they help to lower the cost of production per microelectronic device. Not only are these wafers large and heavy, but they represent relatively expensive material, the more so as a number of time-consuming and complex processing steps are performed upon the wafers.

In the semiconductor manufacturing environment partially processed wafers must frequently be transported among storage areas, processing stations, inspection stations, and other stations.

In contemporary, high production semiconductor manufacturing environments, large-scale wafers are often stored and transported in wafer cassettes, each of which can hold a plurality of wafers, for example up to two dozen wafers. A fully loaded cassette can weigh ten kilograms or more.

Production facilities often have fairly narrow or constricted areas, in which space is at a premium. Thus large, bulky equipment for transporting and storing wafer cassettes is undesirable.

Furthermore, time is also at a premium in such production facilities, so equipment used for storing, transporting, loading, and unloading materials such as semiconductor wafers must be easy to use and require a minimum of operator manipulation.

Furthermore, equipment used in manufacturing environments which are regulated by federal, state, and local laws and regulations must be safe, stable, and ergonomic.

For the reasons stated above, there is a substantial need in the semiconductor manufacturing art for a wafer cassette transport cart and method of use thereof, which are reliable and cost effective, which are safe and easy to use, and which consume a minimum of physical space.

SUMMARY

In one embodiment, a cart for transporting wafer cassettes is described. The cart comprises a support structure and an upright member pivotably coupled to the support structure. The upright member comprises a handle pivotably coupled to a cassette support.

In another embodiment, a method of loading a wafer cassette from a transport cart to a load port is described. The cart includes a wheeled support structure and an upright member pivotably coupled to the support structure. The upright member comprises a cassette support pivotably coupled to a handle. The method comprises moving the cart adjacent the load port, and loading the wafer cassette from the cart to the load port by employing movements of the upright member and the handle.

DETAILED DESCRIPTION

In the following detailed description of the preferred embodiments, reference is made to the accompanying drawings which form a part hereof, and in which is shown by way of illustration specific embodiments in which the invention may be practiced. It is to be understood that other embodiments may be utilized and structural changes may be made without departing from the scope of the present invention.

Figure 1:
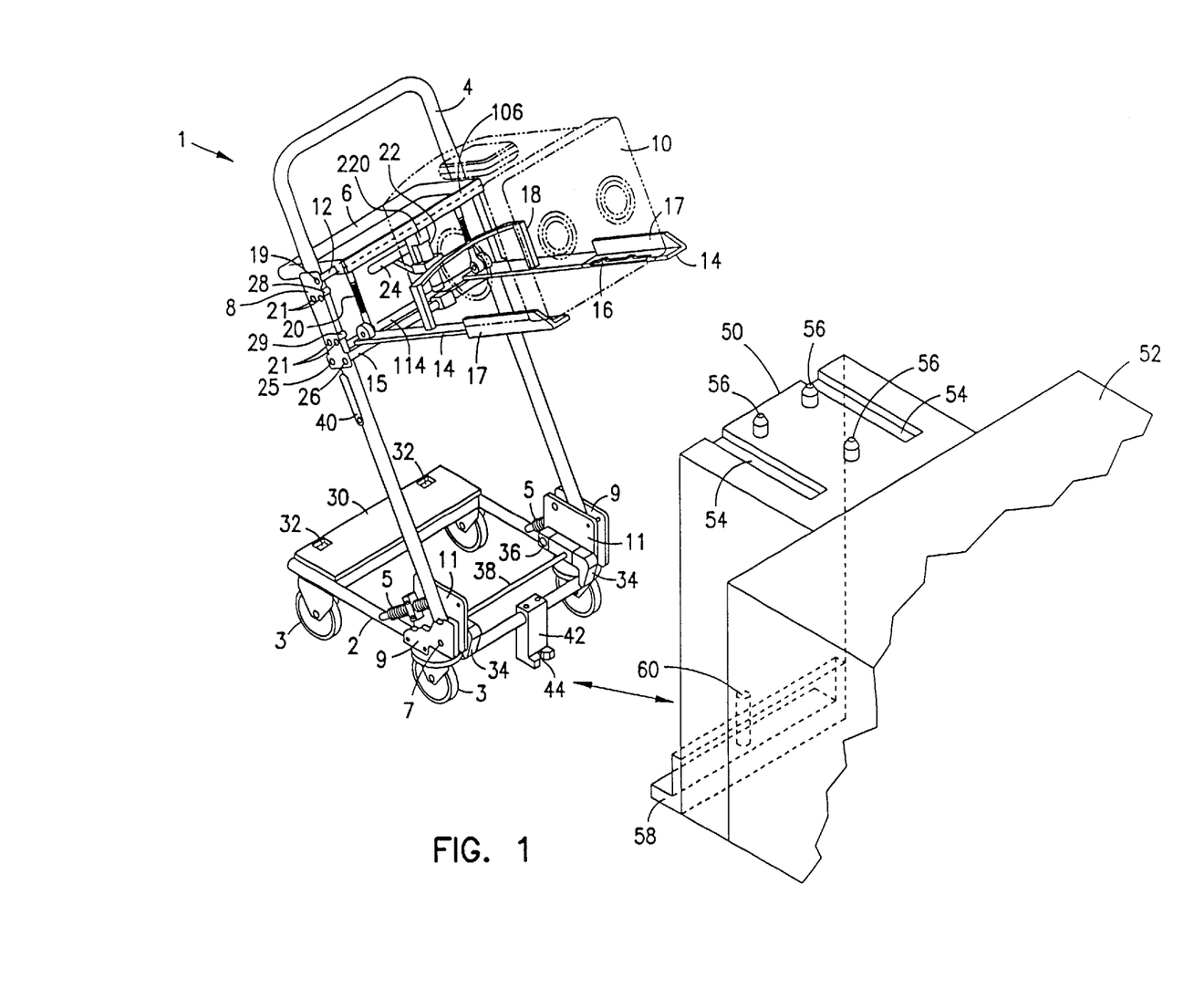
FIG. 1 illustrates a perspective view of a wafer cassette transport cart and a wafer cassette docking station, in accordance with one embodiment of the invention.

FIG. 1 illustrates a perspective view of a wafer cassette transport cart 1 and a wafer cassette docking station 50 in accordance with one embodiment of the invention. Wafer cassette transport cart 1 comprises a wheeled support structure 2. In one embodiment, support structure 2 comprises a set of four wheels 3; however, it will be understood by those skilled in the art that the number of wheels is a design choice, and that fewer or more than four wheels could be used.

Support structure 2 comprises a front portion, which in FIG. 1 is the portion which is closer to docking port 50, and support structure 2 further comprises a rear portion, which is the portion which is further from docking port 50.

An upright member 4 is pivotably coupled to the front portion of support structure 2 by a suitable pivot member or hinge structure. In one embodiment the pivot member comprises a pivot pin 7 which passes through an outer front plate 9, upright member 4, and an inner front plate 11. An identical arrangement can be used on the other side of cart 1, where upright member 4 again is held between plates 9 and 11 by a pivot pin (not shown). It will be understood by those skilled in the art that the upright member 4 can be coupled to other portions of support structure 2 in other embodiments.

Upright member 4 is coupled to a pair of dampers 5, one damper being on either side of cart 1. Dampers 5 can be of any suitable construction which will dampen motion occurring between upright member 4 and support structure 4. In one embodiment, dampers 5 are oil-filled hydraulic dampers. It will be understood by those skilled in the art that other types of dampers, such as pneumatic, magnetic, or spring-loaded dampers, could be used. Dampers 5 are employed to lessen jarring or shocking movements which could damage the contents of wafer cassette 10 (shown in phantom outline in FIG. 1 so as not to obscure the details of wafer transport cart 1).

Handle 6 is coupled to upright member 4 by a pivot rod 12. In FIG. 1 pivot rod 12 can be seen on the side of cart 1 nearer to the viewer. Pivot rod 12 extends between plates 8 and passes through handle 6. Handle 6 can pivot upward and downward about pivot rod 12.

Each plate 8 is secured to upright member 4 by an upper U-bolt and a lower U-bolt around upright member 4. The ends of the U-bolts pass through plate 8 and are secured by cap nuts 21.

A limiter rod 15 extends between plates 8. Limiter rod 15 is secured against each plate 8 by a screw 26 (only the screw 26 nearer the viewer is shown). Limiter rod 15 can be rigidly fastened to plates 8, although it need not be. As will be seen in greater detail in FIGS. 2 and 3, which are described below, limiter rod 15 passes through the lower portion of damper mount 220, which is able to rotate to a limited degree about limiter rod 15.

A wafer cassette support, which comprises a pair of arms 14, is coupled both to upright member 4 and to handle 6. Cassette support arms 14 are rotatably coupled to upright member 4 via bar 114. Bar 114 is secured against each plate 8 by a screw 25 (only the screw 25 nearer the viewer is shown). Bar 114 is free to pivot about screws 25 as cassette support arms 14 are raised and lowered.

Cassette support arms 14 are coupled to handle 6 by a pair of coupling members 20, of which only the coupling member 20 nearer to the viewer is shown. The lower end of each coupling member 20 is pivotably coupled to a lug 13 on the upper surface of the associated cassette support arm 14. The upper end of each coupling member 20 is pivotably coupled to handle 6 by a suitable attachment (not shown).

The geometry and structure of handle 6, upright member 4, wafer cassette support arms 14, and coupling members 20 is such that when handle 6 is depressed, support arms 14 are raised, and when handle 6 is elevated, support arms 14 are lowered. The lift ratio between handle 6 and wafer cassette support arms 14 is approximately 1:3 in one embodiment.

Bar 106 extends between opposite ends of handle 6 and is affixed to handle 6, for example by welding. In one embodiment, bar 106 is rectangular in cross-section, which can be seen more easily in FIGS. 2 and 3.

To dampen and minimize jarring movement of the support arms 14 when they are lowered, damper 22 is provided. Damper 22 is affixed to damper mount 220, which is described in greater detail regarding FIGS. 2 and 3 below. In one embodiment, damper 22 is of the same type as dampers 5; however, it will be understood by those skilled in the art that damper 22 can be different from dampers 5, depending upon the damping requirements of the particular application in which wafer transport cart 1 is used.

Figure 2:
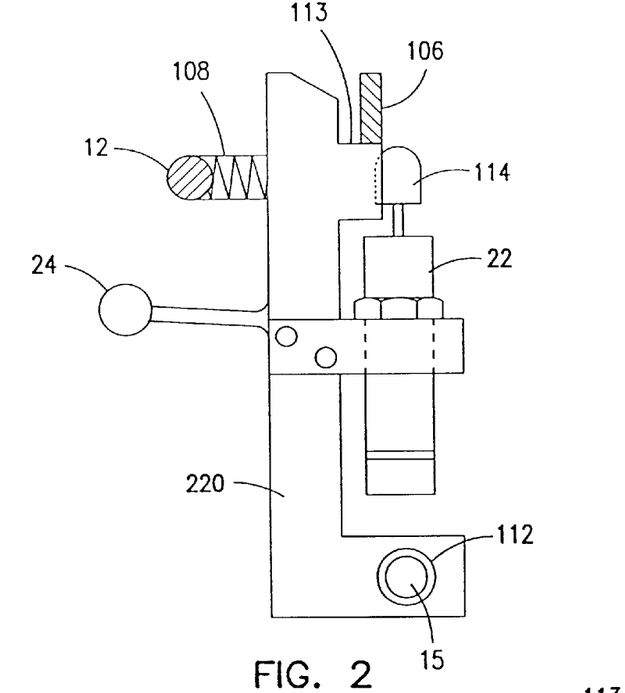
FIG. 2 illustrates a side view of damper mount 220 in a first orientation, in accordance with one embodiment of the invention.

FIG. 2 illustrates a side view of damper mount 220 in a first orientation, in accordance with one embodiment of the invention. Damper mount 220 has a hole 112 through which limiter rod 15 passes. Limiter rod 15 limits the downward motion of cassette support arms 14. Damper mount 220 can rotate through a limited arc about limiter rod 15.

A spring 108 is affixed to damper mount 220. Spring 108 can be of any suitable type. In one embodiment, spring 108 is a leaf spring. Spring 108 presses against pivot rod 12. In FIG. 2 spring 108 is shown uncompressed.

The orientation of damper mount 220 shown in FIG. 2 results after handle 6 (refer to FIG. 1) is depressed far enough to raise bar 106 so that ledge 113 of damper mount 220 slides underneath bar 106 from the compression force of spring 108. Once bar 106 rests upon ledge 113 of damper mount 220, it remains there. This locking mechanism causes cassette support arms 14 to be locked in a upward position. Arms 14 are typically locked in an upward position while cart 1 is in motion or in a standby mode.

Damper 22 has an end cap 114. In the side views of FIGS. 2 and 3, end cap 114 is shown partially positioned within a U-shaped or V-shaped recess in damper mount 220.

Figure 3:
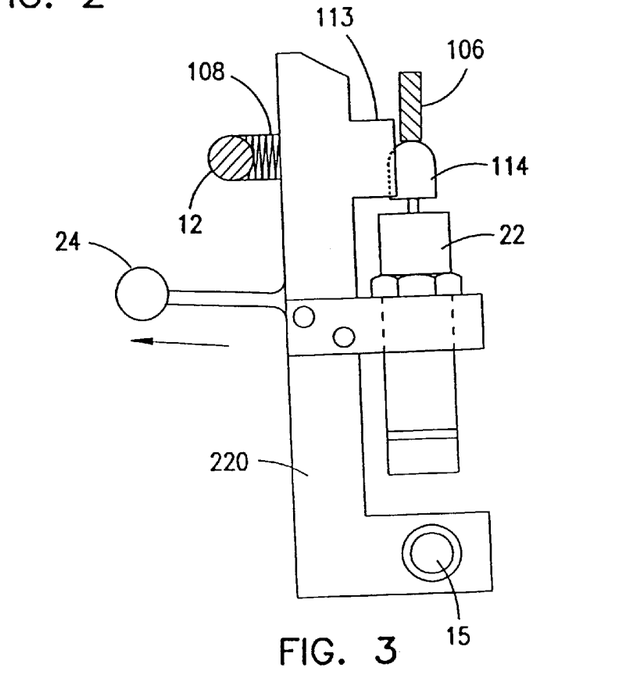
FIG. 3 illustrates a side view of damper mount 220 in a second orientation, in accordance with one embodiment of the invention.

FIG. 3 illustrates a side view of damper mount 220 in a second orientation, in accordance with one embodiment of the invention. The orientation of damper mount 220 shown in FIG. 3, in which damper mount 220 is rotated slightly counter-clockwise, results after release handle 24 is pulled back far enough to let bar 106 slide off ledge 113 of damper mount 220 onto end cap 114 of damper 22. This release mechanism causes bar 106 to slowly sink, which in turn dampens the downward movement of cassette support arms 14 (refer to FIG. 1).

As the release mechanism releases the cassette support to move into a downward position, at the same time spring 108 is depressed. Spring 108 and pivot rod 12 limit the rearward movement of damper mount 220.

Release handle 24 is pulled back when an operator desires to lower the cassette support arms 14, for example when loading or unloading a wafer cassette 10.

Referring once again to FIG. 1, cassette stop 18 serves to keep cassette 10 from sliding too far back on arms 14. In one embodiment, cassette stop 18 bridges wafer cassette support arms 14; however, it will be understood by those skilled in the art that individual cassette stops could be used on each arm 14.

Arms 14 have areas which facilitate holding the wafer cassette 10. For example, arms 14 comprise recessed areas 16 which mate with corresponding mating regions of suitable geometric shape on wafer cassette. Arms 14 also comprise raised edge plates 17 which confine the wafer cassette 10 between arms 14, so that the wafer cassette 10 does not slip sidewise off of either of arms 14.

From the above description of cart 1, it will be understood that the cassette support arms 14 have a predefined range of motion. That is, they can only be raised or lowered within a certain amount. Likewise, it will be understood that the upright member 4 has a predefined range of motion, in that it can only be moved forward or backward within a certain amount. These limitations on the range of motion of the arms 14 and upright member 4 ensure that the wafer cassette 10 will not fall off as it is being stored on transported using wafer transport cart 1.

Also shown in FIG. 1 is a load port 50 of a piece of semiconductor manufacturing equipment 52, of which only a portion is illustrated. Depending upon the level of sophistication of the particular piece of equipment 52, load port 50 can be merely a table-like structure, where wafer cassette is set down for subsequent manual movement, either of individual wafers within the cassette 10 or of the entire cassette 10. Alternatively, load port 50 can be a robotic station where subsequent movement of individual wafers or of the entire wafer cassette is carried out by automated equipment.

Load port 50 comprises mating regions in the form of grooves 54 and alignment pins 56. Arms 14 of transport cart 1 mate with grooves 54 of load port 50 to assist in aligning wafer cassette 10 on alignment pins 56. The lower surface of wafer cassette 10 has indents (not illustrated) which suitably mate with alignment pins 56 to maintain wafer cassette 10 in proper position on load port 50. Alignment pins 56 can have a conical or pointed upper end to facilitate mating with the indents in the lower surface of wafer cassette 10.

At the base of load port 50 is a docking flange 58 which comprises a centering pin 60. The front portion of support structure 2 of cart 1 comprises a centering bar 42 which has a centering notch 44. Centering notch 44 of transport cart 1 mates with centering pin 60 of load port 50 to assist in aligning arms 14 with the grooves 54 in the upper surface of load port 50.

In order to facilitate movement of several transport carts 1 through a manufacturing facility simultaneously, the support structure 2 comprises a coupler to couple a first cart to a cart behind it and, if desired, to a cart ahead of it. Thus strings or trains comprising several carts 1 may be moved simultaneously.

In one embodiment the coupler comprises a pair of hooks 34 on the front portion of the support structure 2, and a pair of apertures 32 in a plate 30 on the rear portion of support structure 2. The hooks 34 at the front of one cart 1 can be operatively engaged with the apertures at the rear of another cart 1.

Hooks 34 pivot about rod 38. Hooks 34 are raised and lowered by movement of a control lever 40, to which a control cable or rod (not shown) is coupled. As control lever 40 is first moved in one direction and then another, hooks 34 are raised and lowered. It will be understood by those skilled in the art that other mechanisms could be provided for raising and lowering hooks 34. For example, with a suitable cam mechanism, they could be raised and lowered by fore and aft movement of upright member 4 relative to support structure 2. Alternatively, they could be electrically, hydraulically, or pneumatically controlled.

FIGS. 4–7 illustrate the operation of a wafer cassette transport cart in accordance with one embodiment of the invention. FIGS. 4–7 depict a sequence of movements by an equipment operator 100 in unloading a wafer cassette 10 at a load port 50, which is part of semiconductor manufacturing equipment 52.

Figure 4:
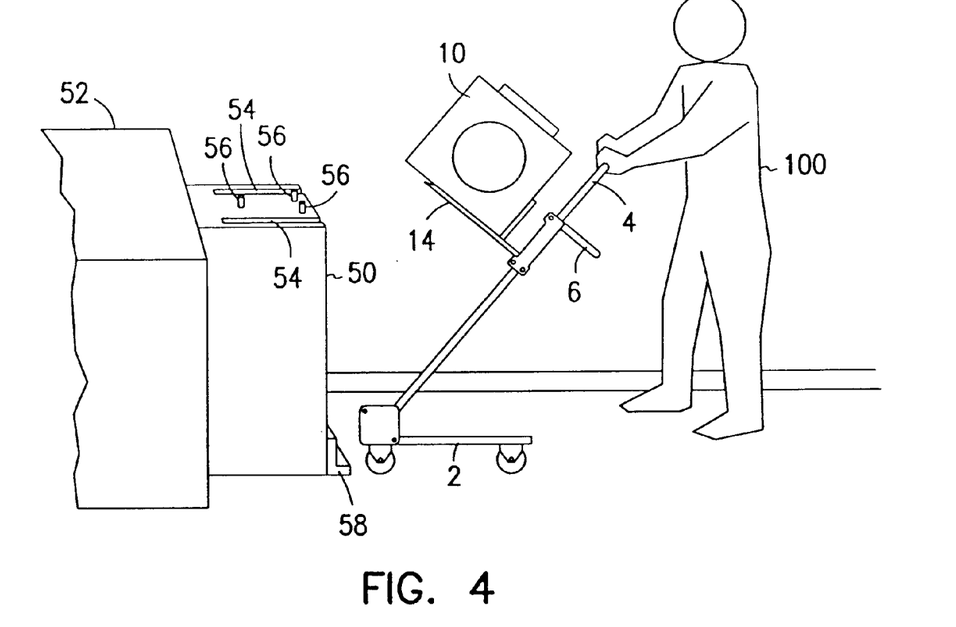
FIG. 4 is one of a sequence of FIGS. 4–7 illustrating the operation of a wafer cassette transport cart, in accordance with one embodiment of the invention.

First, in FIG. 4, operator 100 approaches load port 50 with wafer cassette 10 in an unlocked position on arms 14 of the transport cart. Operator 100 is using the upper portion of upright member 4 to push and maneuver the cart.

Figure 5:
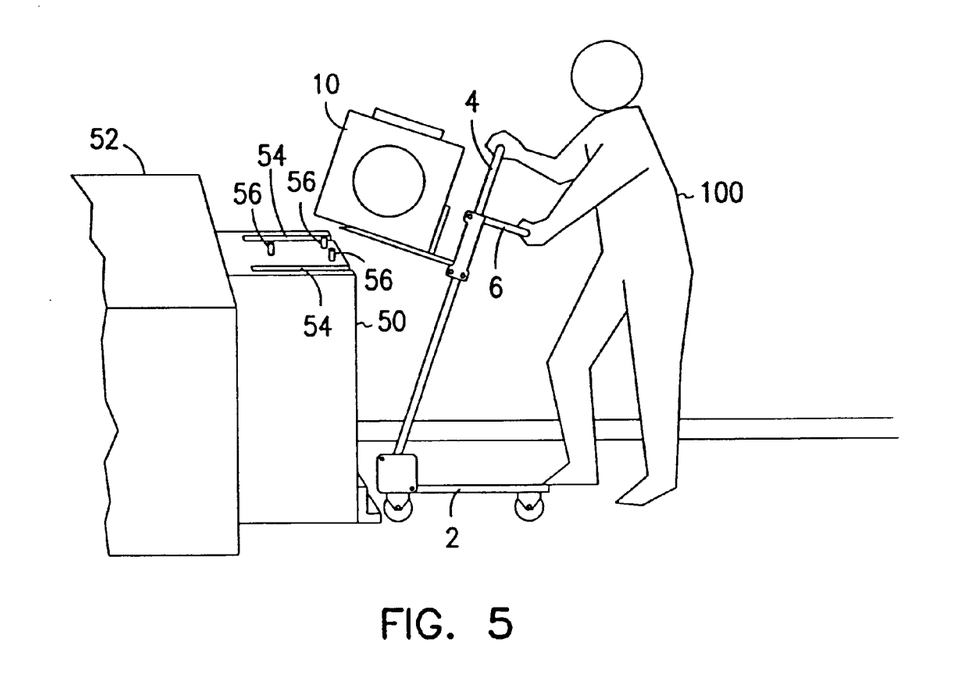
FIG. 5 is one of a sequence of FIGS. 4–7 illustrating the operation of a wafer cassette transport cart, in accordance with one embodiment of the invention.

Next, in FIG. 5, operator 100 momentarily depresses handle 6 while swinging upright member 4 forward toward load port 50. Operator 100 aims arms 14 for the mating grooves 54 in the upper surface of load port 50.

Figure 6:
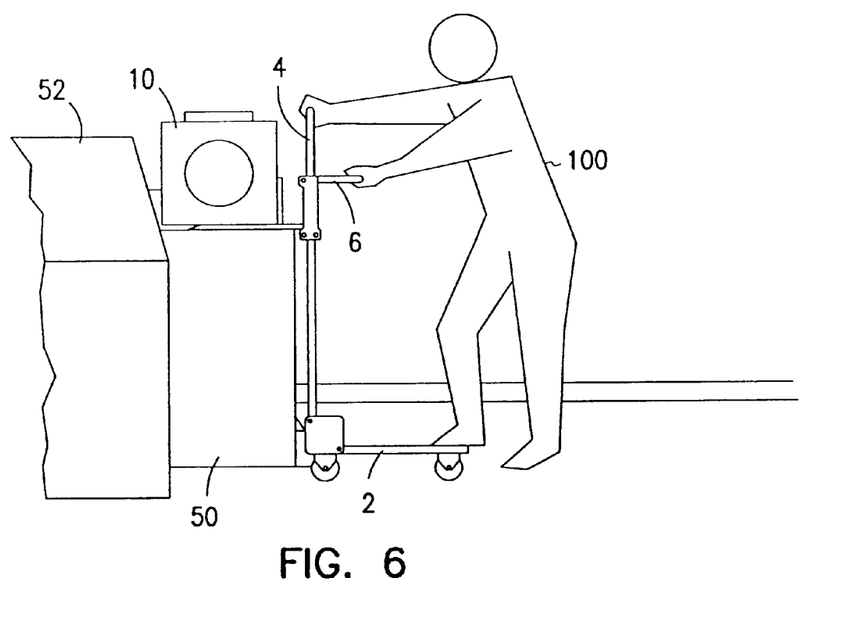
FIG. 6 is one of a sequence of FIGS. 4–7 illustrating the operation of a wafer cassette transport cart, in accordance with one embodiment of the invention.

Next, in FIG. 6, operator 100 has swung upright member 4 forward and has lowered handle 6, so that arms 14 are in grooves 54, and the wafer cassette 10 is resting on alignment pins 56 (FIGS. 1, 4, and 5).

Figure 7:
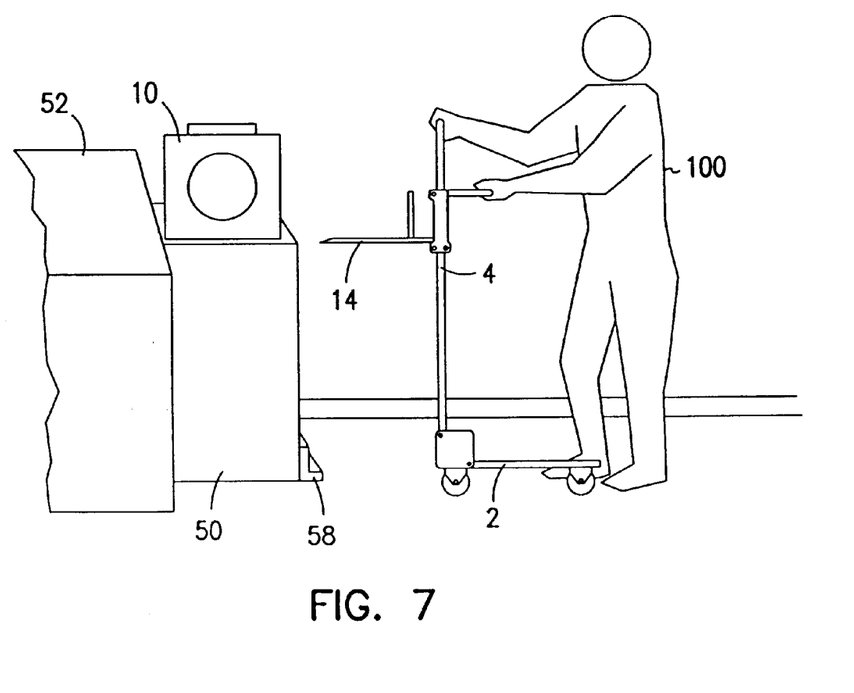
FIG. 7 is one of a sequence of FIGS. 4–7 illustrating the operation of a wafer cassette transport cart, in accordance with one embodiment of the invention.

Finally, in FIG. 7, operator 100 has withdrawn the arms 14 of the cart from grooves 54 (FIGS. 1, 4, and 5) by backing the cart away from load port 50, leaving the wafer cassette 10 mounted atop load port 50 in the desired orientation.

Figure 8:
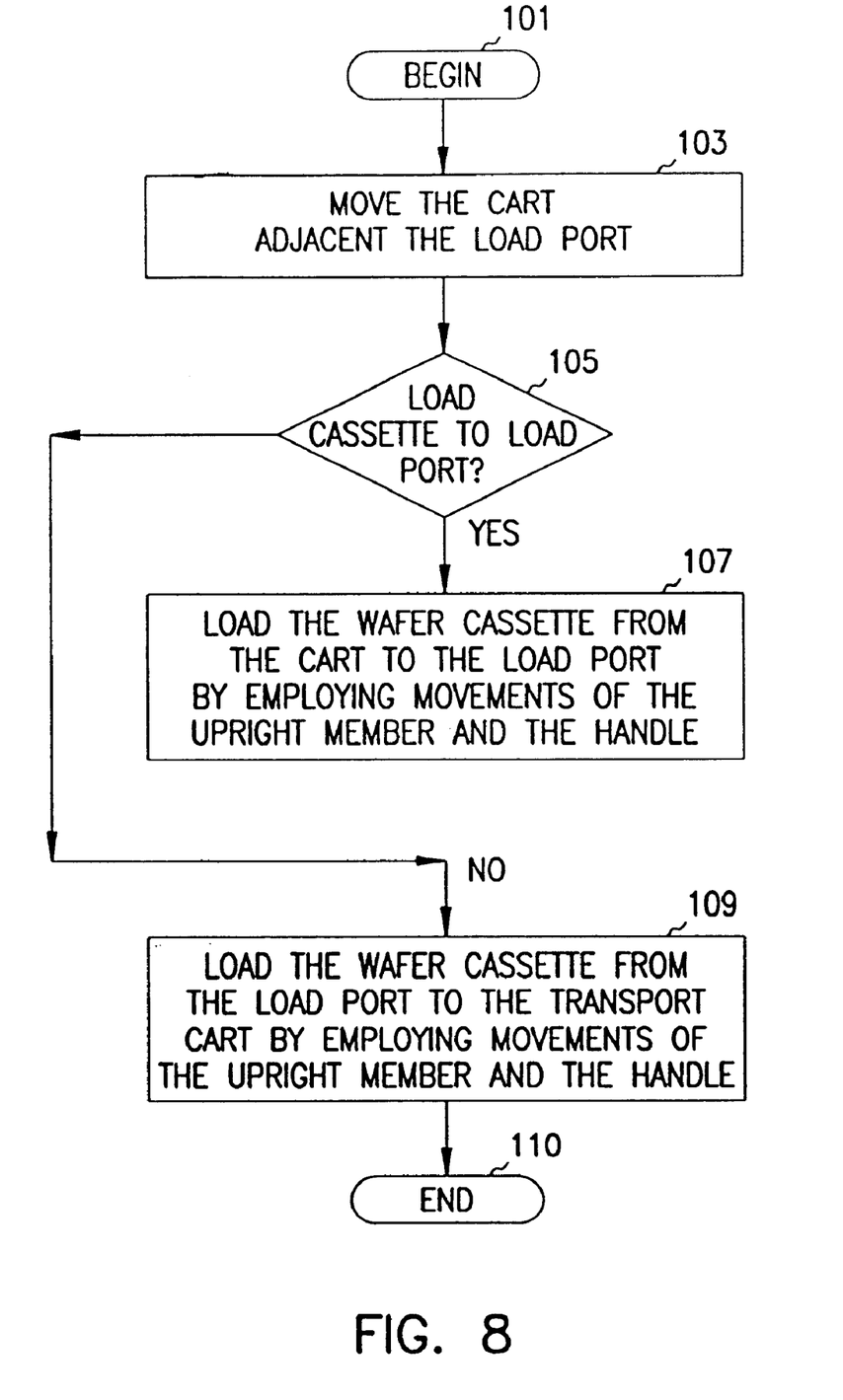
FIG. 8 illustrates a flow diagram of methods for using a wafer cassette transport cart, in accordance with one embodiment of the invention.

FIG. 8 illustrates a flow diagram of methods for using a wafer cassette transport cart 1 in accordance with one embodiment of the invention. According to one method, the transport cart 1 is used to load a wafer cassette 10 onto a load port 50. According to another method, the transport cart 1 is used to load a wafer cassette 10 from a load port 50 onto the cart 1.

The method starts in block 101.

In block 103 the cart is moved adjacent to the load port. This can be performed either by a human operator or by robotic equipment.

In decision block 105, a determination is made as to which type of operation is to be performed. If the wafer cassette is to be loaded to the load port, the method proceeds to block 107, where the cassette is loaded to the load port by employing movements of the upright member 4 and the handle 6, as shown in FIGS. 4–7.

If the cassette is to be unloaded from load port 50, the method proceeds to block 108, where the cassette is loaded from the load port 50 to the cart 1, by essentially reversing the movements depicted in FIGS. 4–7.

The method ends in block 110.

In summary, the present invention provides a wafer cassette transport cart and method of use thereof, which are reliable and cost effective, which are safe and easy to use, and which consume a minimum of physical space.

It will be apparent to those skilled in the art that the disclosed invention can be modified in numerous ways and can assume many embodiments other than the preferred form specifically set out and described above.

Wafer transport cart 1 could be constructed so as to be foldable or collapsible. It could also be constructed to be stackable.

The present invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed is:

1. A cart for transporting a wafer cassette, the cart comprising:

a support structure; and an upright member pivotably coupled to the support structure, the upright member being movable between a first position wherein the upright member and the support structure are at an acute angle with respect to each other, and a second position wherein the upright member and the support structure are at a less acute angle with respect to each other, the upright member comprising a handle pivotably coupled to a cassette support, the handle being movable between a first position wherein the cassette support is in a lowered position relative to the upright member, and a second position, wherein the cassette support is in a raised position relative to the upright member, wherein the cassette support comprises a pair of arms, each arm comprising a base coupled to the handle by a coupling member, each arm further comprising a tip, and wherein the height of the tips of the arms is greater or equal to the height of the bases of the arms when the handle is in the first position, irrespective of the position of the upright member.

2. The cart recited in claim 1, wherein the arms comprise mating regions to couple with corresponding mating regions on the cassette.

3. The cart recited in claim 1, wherein the arms are formed to mate with mating regions on a load port.

4. A method of loading a wafer cassette from a transport cart to a load port, the cart including a wheeled support structure and an upright member pivotably coupled to the support structure, the upright member being movable between a first position wherein the upright member and the support structure are at an acute angle with respect to each other, and a second position wherein the upright member and the support structure are at a less acute angle with respect to each other, the upright member comprising a cassette support pivotably coupled to a handle, the handle being movable between a first position wherein the cassette support is in a lowered position relative to the upright member, and a second position, wherein the cassette support is in a raised position relative to the upright member, the method comprising:

moving the cart adjacent the load port; and loading the wafer cassette from the cart to the load port by moving the upright member into the second position, and by moving the handle into the first position.

5. A method of loading a wafer cassette from a load port to a transport cart, the cart including a wheeled support structure and an upright member pivotably coupled to the support structure, the upright member being movable between a first position wherein the upright member and the support structure are at an acute angle with respect to each other, and a second position wherein the upright member and the support structure are at a less acute angle with respect to each other, the upright member comprising a cassette support pivotably coupled to a handle, the handle being movable between a first position wherein the cassette support is in a lowered position relative to the upright member, and a second position, wherein the cassette support is in a raised position relative to the upright member, the method comprising:

moving the cart adjacent the load port;

loading the wafer cassette from the load port to the transport cart by moving the upright member into the second position, and by moving the handle into the second position; and     locking the handle in the second position.

* * * * *

UNITED STATES PATENT AND TRADEMARK OFFICE
CERTIFICATE OF CORRECTION

PATENT NO.     : 6,364,331 B1
DATED          : April 2, 2002
INVENTOR(S)    : Hoon-Ueng Yap It is certified that error appears in the above-identified patent and that said Letters Patent is hereby corrected as shown below:

<u>Title page,</u>
The title page should be deleted to appear as per attached title page.

<u>Drawings,</u>
The sheet of drawing, consisting of figure 1, should be deleted to appear as per attached figure 1.

Signed and Sealed this

Tenth Day of September, 2002

*Attest:*

*Attesting Officer*

JAMES E. ROGAN
*Director of the United States Patent and Trademark Office*

United States Patent
Yap (10) Patent No.: US 6,364,331 B1
(45) Date of Patent: Apr. 2, 2002

(54) METHOD AND APPARATUS FOR TRANSFERRING WAFER CASSETTES IN MICROELECTRONIC MANUFACTURING ENVIRONMENT

(75) Inventor: Hoon-Yeng Yap, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/410,400

(22) Filed: Oct. 1, 1999

(51) Int. Cl.$^7$ .............................. B62B 3/04; B62B 3/10
(52) U.S. Cl. .............................. 280/47.371; 280/47.29; 280/651
(58) Field of Search .............................. 280/47.2, 47.22, 280/47.28, 47.29, 47.34, 47.35, 47.371, 79.11, 79.3, 400, 638, 639, 651, 655, 35

(56) References Cited

U.S. PATENT DOCUMENTS

| | | | |
|---|---|---|---|
| 2,744,761 A | * 5/1956 | Steele | 280/47.22 |
| 3,499,658 A | * 3/1970 | Fernholz et al. | 280/47.2 |
| 3,540,753 A | * 11/1970 | Hanson | 280/47.34 |
| 3,711,111 A | * 1/1973 | Crawford | 280/47.22 |
| 3,966,221 A | * 6/1976 | Beam et al. | 280/79.3 |
| 4,091,942 A | * 5/1978 | Shelton | 280/47.2 |
| 4,266,765 A | * 5/1981 | Sandoval et al. | 280/47.371 |
| 4,493,492 A | * 1/1985 | Balabanova | 280/79.11 |
| 4,557,201 A | * 12/1985 | Webb, Jr. | 280/79.11 |
| 4,655,466 A | * 4/1987 | Hanaoka | 280/47.34 |
| 4,681,330 A | * 7/1987 | Misawa | 280/47.2 |
| 4,863,179 A | * 9/1989 | Isaacs | 280/79.11 |
| 5,842,708 A | * 12/1998 | Miyaoka | 280/47.35 |
| 5,938,396 A | * 8/1999 | Audet | 280/47.29 |

FOREIGN PATENT DOCUMENTS

| | | | |
|---|---|---|---|
| GB | 933343 | * 8/1963 | 280/47.29 |
| GB | 2248219 | * 4/1992 | 280/47.29 |

* cited by examiner

*Primary Examiner*—Frank Vanaman
(74) *Attorney, Agent, or Firm*—Schwegman, Lundberg, Woessner & Kluth, P.A.

(57) ABSTRACT

A wafer transport cart comprises a wheeled support structure and an upright member which is pivotably coupled to the support structure. The upright member has a handle which is pivotably coupled to a wafer cassette support, which comprises a pair of fork-like arms. Wafer production personnel can maneuver the cart adjacent a wafer manufacturing load port, and unload a wafer cassette from the cart to the load port or vice versa, by employing movements of the upright member and the handle. Shock-absorbing dampers are provided for the upright member and the handle. An inter-cart coupling mechanism enables a plurality of carts to be joined together for tandem transport within the manufacturing facility. The arms mate with mating regions on the wafer cassette and on the load port. An alignment notch mates with an alignment pin on the load port. Also described are methods of using the wafer transport cart to load and unload a wafer cassette.

5 Claims, 5 Drawing Sheets

FIG. 1

UNITED STATES PATENT AND TRADEMARK OFFICE
CERTIFICATE OF CORRECTION

PATENT NO. : 6,364,331 B1
DATED : April 2, 2002
INVENTOR(S) : Alex F. Stewart et al.

It is certified that error appears in the above-identified patent and that said Letters Patent is hereby corrected as shown below:

<u>Title page,</u>
Item [75], Inventor, delete "Hoon-Yeng Yap, Tempe, AZ" and insert the following:

-- Alex F. Stewart, Tempe; Hao Chien, Chandler; Hy Putterflam, Phoenix; Hoon-Yeng Yap, Tempe; all of Arizona --.

Signed and Sealed this

Tenth Day of June, 2003

JAMES E. ROGAN
*Director of the United States Patent and Trademark Office*